United States Patent [19]
McMinn et al.

[11] Patent Number: 5,734,672
[45] Date of Patent: Mar. 31, 1998

[54] SMART LASER DIODE ARRAY ASSEMBLY AND OPERATING METHOD USING SAME

[75] Inventors: Theodore S. McMinn, St. Peters; Dana A. Marshall, Frontenac; Michael A. Hope, Brentwood; Geoffrey O. Heberle, Chesterfield, all of Mo.

[73] Assignee: Cutting Edge Optronics, Inc., St. Louis, Mo.

[21] Appl. No.: 692,600

[22] Filed: Aug. 6, 1996

[51] Int. Cl.$^6$ ............................................ H01S 3/19
[52] U.S. Cl. ..................... 372/50; 372/33; 372/38; 372/43; 372/36; 372/68
[58] Field of Search ................. 372/7, 9, 29, 33, 372/34, 36, 43, 45, 50, 68, 108, 109, 38

[56] References Cited

U.S. PATENT DOCUMENTS

| | | | |
|---|---|---|---|
| 3,339,151 | 8/1967 | Smith | 372/50 X |
| 3,590,248 | 6/1971 | Chatteron, Jr. | 372/43 X |
| 3,771,031 | 11/1973 | Kay | 372/43 X |
| 3,962,655 | 6/1976 | Selway et al. | 372/43 X |
| 4,315,225 | 2/1982 | Allen, Jr. et al. | 372/36 X |
| 4,393,393 | 7/1983 | Allen, Jr. et al. | 372/43 X |
| 4,454,602 | 6/1984 | Smith | 372/36 |
| 4,716,568 | 12/1987 | Scifres et al. | 372/36 |
| 4,831,629 | 5/1989 | Paoli et al. | 372/50 |
| 4,847,848 | 7/1989 | Inoue et al. | 372/50 |
| 4,901,330 | 2/1990 | Wolfram et al. | 372/75 |
| 4,975,923 | 12/1990 | Buus et al. | 372/50 |
| 5,022,042 | 6/1991 | Bradley | 372/75 |
| 5,040,187 | 8/1991 | Karpinski | 372/50 |
| 5,073,838 | 12/1991 | Ames | 372/36 X |
| 5,105,429 | 4/1992 | Mundinger et al. | 372/34 |
| 5,128,951 | 7/1992 | Karpinski | 372/50 |
| 5,163,064 | 11/1992 | Kim et al. | 372/50 |
| 5,212,699 | 5/1993 | Masuko et al. | 372/34 |
| 5,216,263 | 6/1993 | Paoli | 372/50 X |
| 5,216,688 | 6/1993 | Kortz et al. | 372/75 |
| 5,284,790 | 2/1994 | Karpinski | 437/129 |
| 5,287,375 | 2/1994 | Fujimoto | 372/38 |
| 5,305,344 | 4/1994 | Patel | 372/50 |
| 5,311,535 | 5/1994 | Karpinski | 372/50 |
| 5,323,411 | 6/1994 | Shirasaka et al. | 372/43 |
| 5,325,384 | 6/1994 | Herb et al. | 372/36 |
| 5,337,325 | 8/1994 | Hwang | 372/36 |
| 5,351,259 | 9/1994 | Ishimori et al. | 372/75 |
| 5,394,426 | 2/1995 | Joslin | 372/50 |
| 5,402,436 | 3/1995 | Paoli | 372/50 |
| 5,402,437 | 3/1995 | Mooradian | 372/92 |
| 5,438,580 | 8/1995 | Patel et al. | 372/36 |
| 5,526,373 | 6/1996 | Karpinski | 372/101 |
| 5,663,979 | 9/1997 | Marshall | 372/103 |

OTHER PUBLICATIONS

Thomson–CSF Semiconductor Specifiques, Package Specification(schematic), p. 3 (one page) (no date of publication).
Coherent Laser Group, Laser Diodes and Bars (article) (5 pages) (no date of publication).

Primary Examiner—Brian Healy
Attorney, Agent, or Firm—Arnold, White & Durkee

[57] ABSTRACT

A laser diode array assembly includes a laser diode array and a memory device integrally packaged with the array. The memory device includes operational information concerning the array. The memory device is accessible by a host external operating system which determines the manner in which the array is to be powered based on the operational information. The memory device may have the capability to be written to such that the external operating system can record in the memory device significant events such as extreme operational conditions, operational faults, and the on-time or shot-count of the array. The assembly may include sensors to which the operating system is coupled. The assembly may further include a processing means to monitor the sensors and provide real-time updates to the external operating system such that laser diode array is continuously powered in an optimal manner.

76 Claims, 12 Drawing Sheets

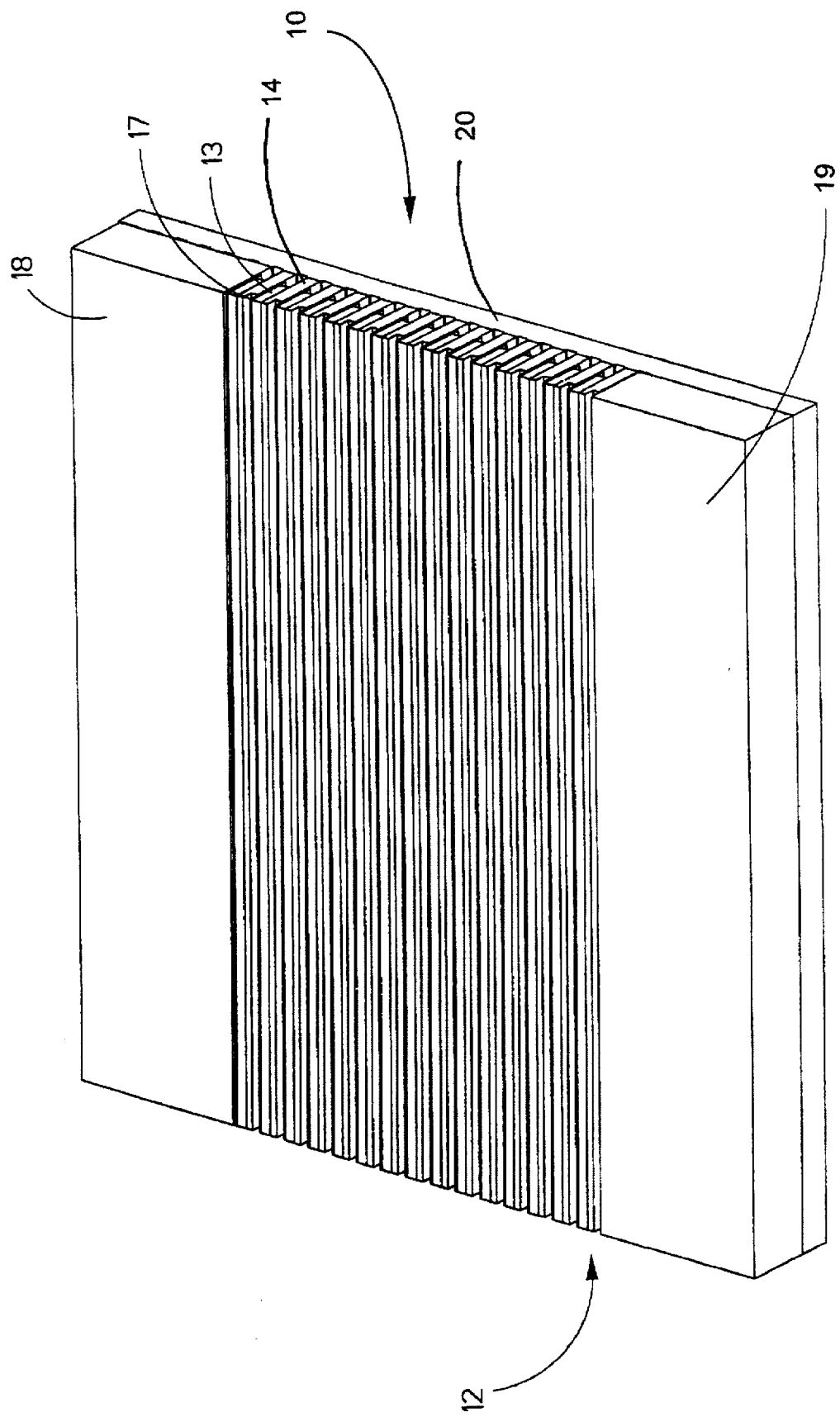

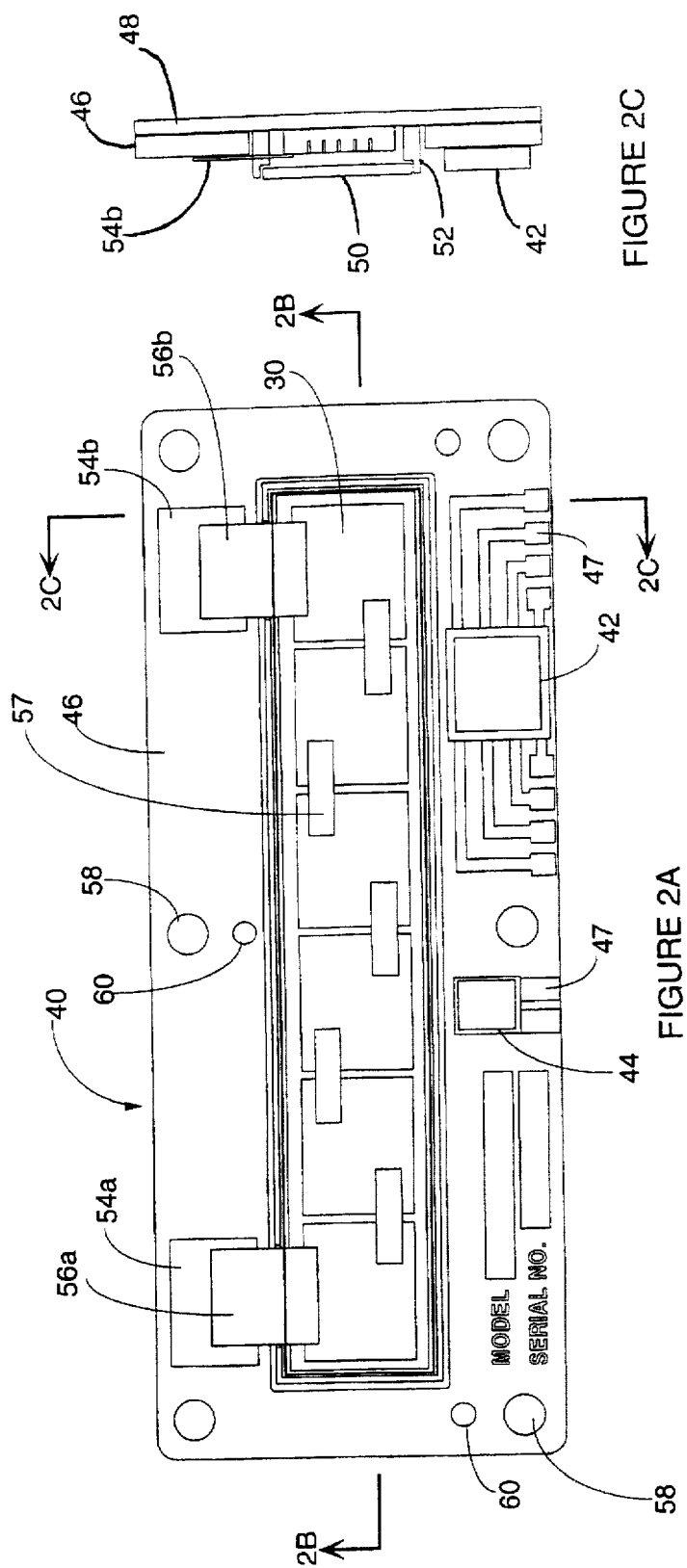
FIGURE 2A
FIGURE 2B
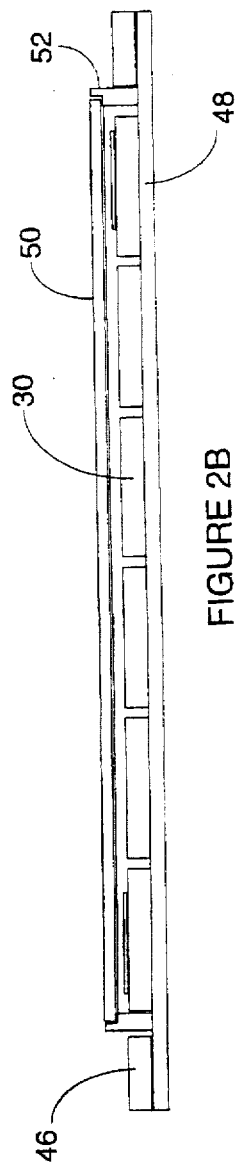
FIGURE 2C

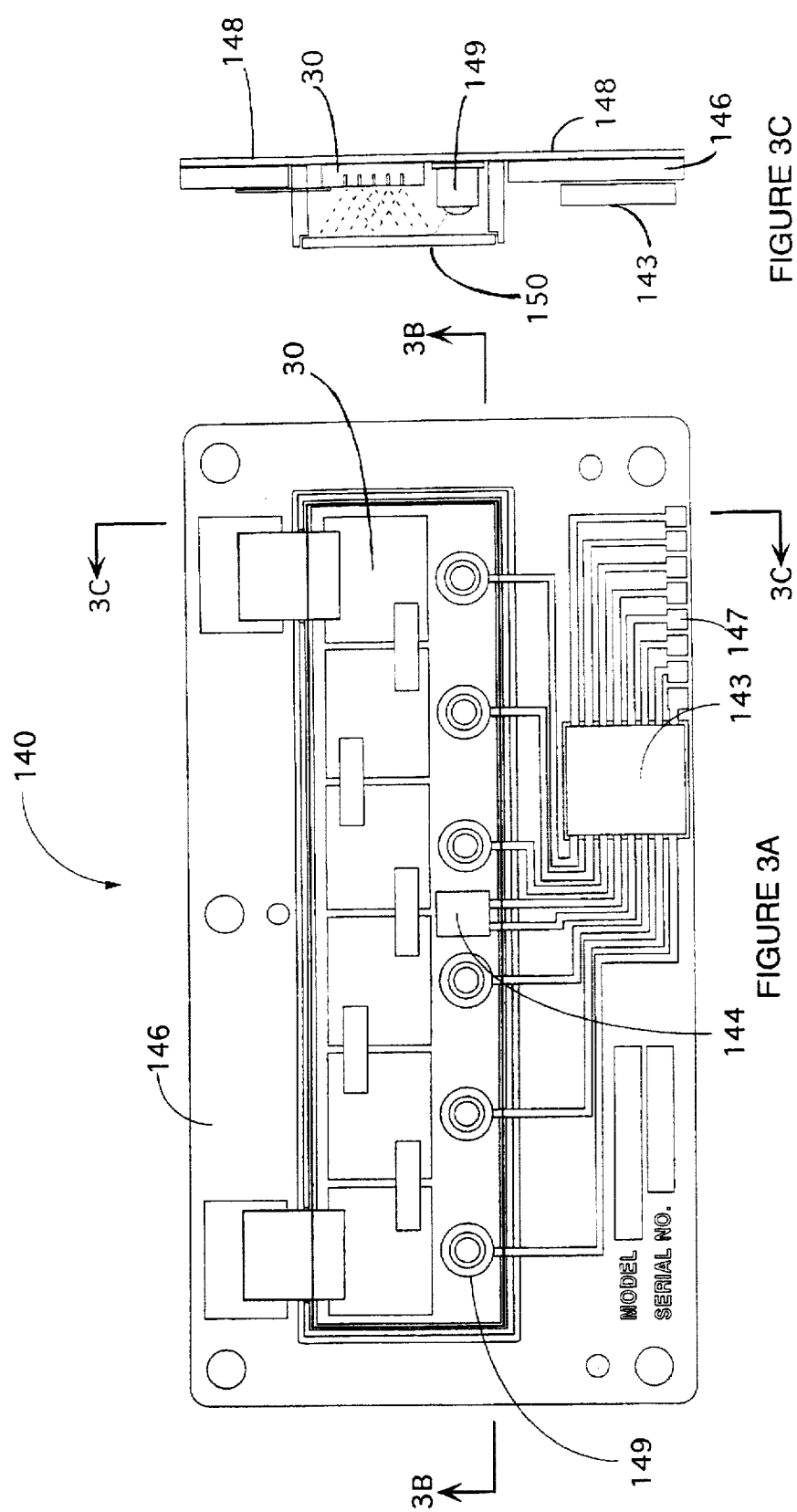

SMART LASER DIODE ARRAY ASSEMBLY AND OPERATING METHOD USING SAME

FIELD OF THE INVENTION

The present invention relates generally to lasers diodes and, in particular, to an assembly that includes a laser diode array, an integral memory device storing operational information about the laser diode array, and an integral processing device that records information to and retrieves information from the memory device.

BACKGROUND OF THE INVENTION

Semiconductor laser diodes have numerous advantages. They are small in that the widths of their active regions are typically submicron to a few microns and their heights are usually no more than a fraction of a millimeter. The length of their active regions is typically less than about a millimeter. The internal reflective surfaces, which are required in order to produce emission in one direction, are formed by cleaving the substrate from which the laser diodes are produced and, thus, have high mechanical stability. Additionally, high efficiencies are possible with semiconductor laser diodes with pulsed junction laser diodes having external quantum efficiencies near 50% in some cases.

The cost and packaging of laser diodes are problems that has limited their commercialization. It is only recently that both the technology and availability of laser diode bars, and a method for packaging them, has made two dimensional laser diode pump arrays a commercial reality. One technique for producing such a two dimensional laser diode array is demonstrated in the U.S. Pat. Nos. 5,040, 187 and 5,128,951 to Karpinski. Also, newer techniques have been used to make more efficient an older packaging approach whereby individual diodes are sandwiched between two metallic foils. The advent of lower cost laser diodes and efficient packaging has led to the possibility of producing very large, solid-state laser systems which use many pump arrays.

While laser diode pump arrays have a relatively long life when compared to the traditional flash-lamp or arc-lamp pump sources, they are still considered consumable items that require periodic replacement. In some cases with modularized laser diode arrays, one may even wish to replace only a portion of the array. For pulsed lasers, the number of shots which the laser diode arrays have fired is recorded. For continuous-wave (CW) lasers, the amount of time the laser diode arrays have operated (time-on) is of interest. Typically, these values are monitored and stored within the external electronic control systems which operate these laser systems. These electronic control systems must contain a shot-counter or time-on counter for each laser diode pump array to determine the relative age of each laser diode array thereby permitting the development of a replacement schedule for each laser diode array. However, when a laser diode pump array is replaced, these shot-counters or on-timers must have the ability to be reset to zero if a new laser diode array is used. If a used laser diode array is installed, then these shot-counters or on-timers must have the ability to be reset to a predetermined value. Furthermore, when a laser diode array is removed from a system for replacement, a difficulty arises in that there is no longer a shot count or on-time associated with the pump array, unless written records are meticulously kept.

In addition to the shot-count, there is other information about a diode array that is of particular interest, such as the serial number of the array, the number and frequency of over-temperature fault conditions, and the voltage drop (i.e. the resistance rise) across the array. These characteristics are useful for selecting an application for a used laser diode array, or for determining the causes of its failure. These characteristics are also important for warranty purposes. However, the operator of the system has no interest in recording these data since it may limit his or her ability to rely on the warranty when a failure arises. On the other hand, the manufacturer has a keen interest in knowing the operational history of an array for warranty purposes.

When semiconductor laser diodes are used as the optical pumping source for larger, solid-state laser systems, the emitted wavelength is critical. Laser diode pump arrays achieve efficient pumping of the laser host material (e.g. Neodymium-doped, Yttrium-Aluminum Garnet) by emitting all of their light energy in a very narrow spectral band which is matched to the absorption spectrum of the gain media (i.e. slabs, rods, crystals etc.), typically within 2–6 nanometers full-width at the half-maximum point (fwhm). The laser diode pump array emission wavelength is a function of the temperature at which the pump array is operated. The pump array temperature is a complicated function of many interrelated variables. The most important of these variables are the temperature of the coolant flowing to the diode array, the operational parameters of the diode array, and the configuration of the heat exchanger on which the laser diodes are mounted. The operational parameter of a CW driven array is simply the drive current. But for pulsed laser systems, the peak drive current, the repetition rate, and the pulse width of the drive current are all important operational parameters. Because the performance of the laser diode array changes during the service life of a laser diode array, the host external system controller has to compensate for any degradation of performance (output power or wavelength) by modifying these input operational parameters except for the heat exchanger configuration. Often, the altering of the operational parameters requires manual calibration of the arrays using external optical sensors. This is a tedious job and requires a skilled technician who understands the ramifications of modifying the interrelated variables which change the output power and wavelength. Even when the laser diode array's operational parameters are properly calibrated, rapid changes in the performance of the laser diode array may go unnoticed until the next scheduled maintenance. This manual calibration also is often required during the initial installation of the laser diode array assembly.

Therefore, a need exists for a laser diode array assembly that includes an integral means for recording operational events and maintaining this information with the assembly throughout its service life. It would also be beneficial for this laser diode array assembly to have the capability of instructing the external laser operating system on the input drive parameters that should be used to provide for optimal output of the laser diode array assembly.

SUMMARY OF THE INVENTION

A modular laser diode array assembly includes at least one laser diode array, an intermediate structure on which the array is mounted, and an integral memory device. The laser diode array has a plurality of laser diodes which are in electrical contact with at least one other of the plurality of laser diodes. The assembly further includes means for supplying external power to the laser diode array. The memory device stores operating information for the laser diode array and is mounted on the intermediate structure which may be a printed circuit board. The memory device communicates with an external operating system. After the assembly is installed in and connected to the external operating system, a system controller accesses the memory device to obtain the operating information (temperature, input power parameters, etc.) which enables the system controller to properly apply power to, or set conditions for, the laser diode array.

In another embodiment, the assembly includes sensors for sensing the operating conditions experienced by the laser diode array. The external operating system monitors the sensors to assist in determining the operational parameters at which the system is to be operated. These sensors may be optical power sensors, optical wavelength sensors, electrical input power sensors, temperature sensors, vibration sensors, etc.

In yet another embodiment, the assembly includes processing means that communicates with the external operating system. The processing means is coupled to the sensors for directly monitoring the operating conditions of the laser diode array and is also coupled to the memory device. Based on the operating conditions monitored, the processing means instructs the external operating system to supply the optimum operating parameters. Thus, the assembly is self-calibrating in that it monitors the operating conditions and instructs the external operating system to provide input power in a manner that allows for the optimum output.

Using the integral memory device and the processing means provides numerous benefits. For example, the shot-count or on-time value becomes physically a part of the assembly as it is stored within the integral memory device. This integral memory device could then be read from and updated, as necessary, by the control electronics of the external operating system or the processing means when one is used.

There are many additional pieces of data which could be stored in this memory device, such as: the array serial number; the number and times of fault conditions such as over temperature or activation of protection circuitry; the voltage drop across the array and the time of the occurrence if it changes significantly (this may be an indication of individual laser bar failures); and the array's spectral and power response to different operational conditions. The memory device may also record the ambient environmental conditions such as the ambient temperature, the ambient shock environment, ambient humidity, or electrostatic discharge (ESD) events resulting from the environment around the array.

The above summary of the present invention is not intended to represent each embodiment, or every aspect, of the present invention. This is the purpose of the figures and the detailed description which follow.

BRIEF DESCRIPTION OF THE DRAWINGS

Other objects and advantages of the invention will become apparent upon reading the following detailed description and upon reference to the drawings in which:

FIG. 1A is a perspective view of a laser diode array used in the present invention;

FIGS. 2A-2D are views of a multiple-array assembly having an integral memory device and a sensor;

FIGS. 3A-3C are views of a multiple-array assembly having an integral processing device including a memory device, a sensor, and multiple photodetectors;

Figure 1B:
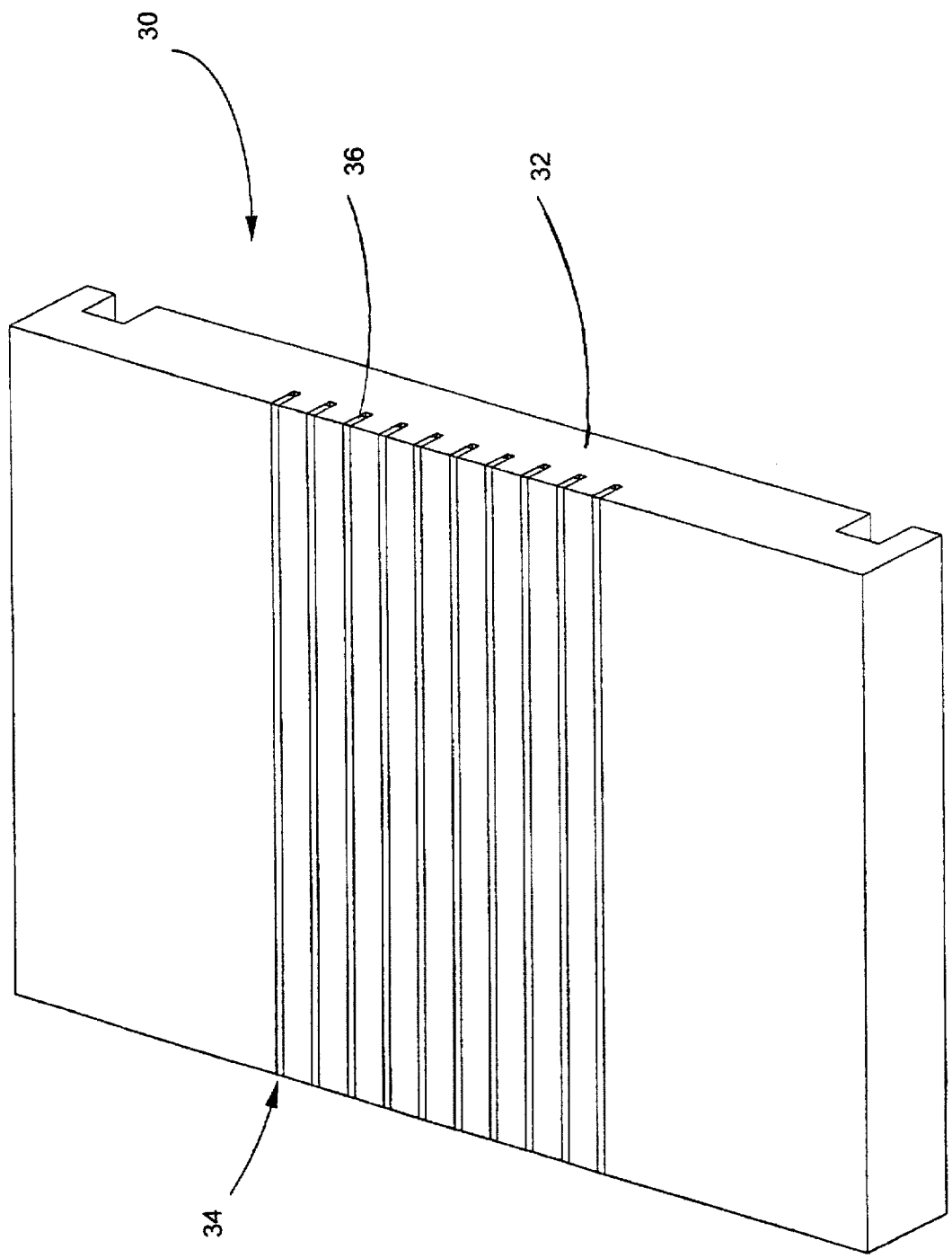
FIG. 1B is a perspective view of another laser diode array used in the present invention.

While the invention is susceptible to various modifications and alternative forms, a specific embodiment thereof has been shown by way of example in the drawings and will herein be described in detail. It should be understood, however, that it is not intended to limit the invention to the particular forms disclosed. Quite to the contrary, the intent is to cover all modifications, equivalents, and alternatives falling within the spirit and scope of the invention as defined by the appended claims.

DETAILED DESCRIPTION OF THE INVENTION

Referring initially to FIG. 1A, a laser diode array 10 is illustrated in a perspective view. The laser diode array 10 includes a plurality of laser diodes packages 12 each of which includes a laser diode 13 sandwiched between a heat sink 14 and a lid 17. The laser diode packages 12 are arranged in a parallel fashion commonly referred to as a stack. At the ends of the stack are endcaps 18 and 19 through which power is supplied to the stack of laser diode packages 12. A thermal backplane 20, usually made of an electrically insulative material, such as beryllium oxide, is the surface to which each of the packages 12 is mounted. The laser diode array 10 is one type of array that can be used in the present invention.

In FIG. 1B, a second type of laser diode array 30 is illustrated. The laser diode array 30 includes a substrate 32 made of an electrically insulative material and a plurality of grooves 34 which are cut in the substrate 32. Within each groove 34 is a laser diode bar 36. To conduct electricity through the plurality of laser diode bars 36, a metallized layer is placed within each groove 34 and connects adjacent grooves 34. The bottom of the substrate 32 is the backplane through which heat flows to the heat exchanger positioned below the bottom. Although the number of grooves 34 is shown as ten, the application of the array 30 dictates the amount laser diode bars 36 and, therefore, the number of grooves 34. Laser diode array 30 is another type of laser diode array that can be used with the present invention.

FIGS. 2A-2D are views of an assembly 40 having six laser diode arrays 30, an integral memory device 42, and a sensor 44. The memory device 42 and the sensor 44 are mounted on a printed circuit board (PCB) 46. The information on the memory device 42 can be accessed and the sensor 44 can be monitored through contact pads 47 located on the PCB 46. A board heat sink 48 is disposed on the back of the PCB 46 and is the surface to which the backplanes of the laser diode arrays 30 are attached. The diode arrays 30 can be soldered to this heat sink 48 or fastened in other ways which minimize the thermal resistance across the interface of the heat sink 48 and the laser diode array 30.

The sensor 44 can be of a type that measures output power or output wavelength (assuming it receives the emitted light). More commonly, the sensor 44 is a temperature sensor since the temperature of the arrays 30 is critical to their operation. If the sensor 44 is a temperature sensor, it could be moved to a location closer to the backplanes of the arrays 30. The sensor 44 may also be an ESD sensor or one that measures the shot-count or on-time of the array 30. Furthermore, the PCB 46 may contain multiple sensors although only one sensor 44 is shown.

The memory device 42 preferably is a non-volatile memory device such that the information stored therein is not altered when power is removed from the memory device 42. An example of such a memory device 42 is the model 24632, manufactured by Microchip, of Chandler, Ariz.

Figure 2D:
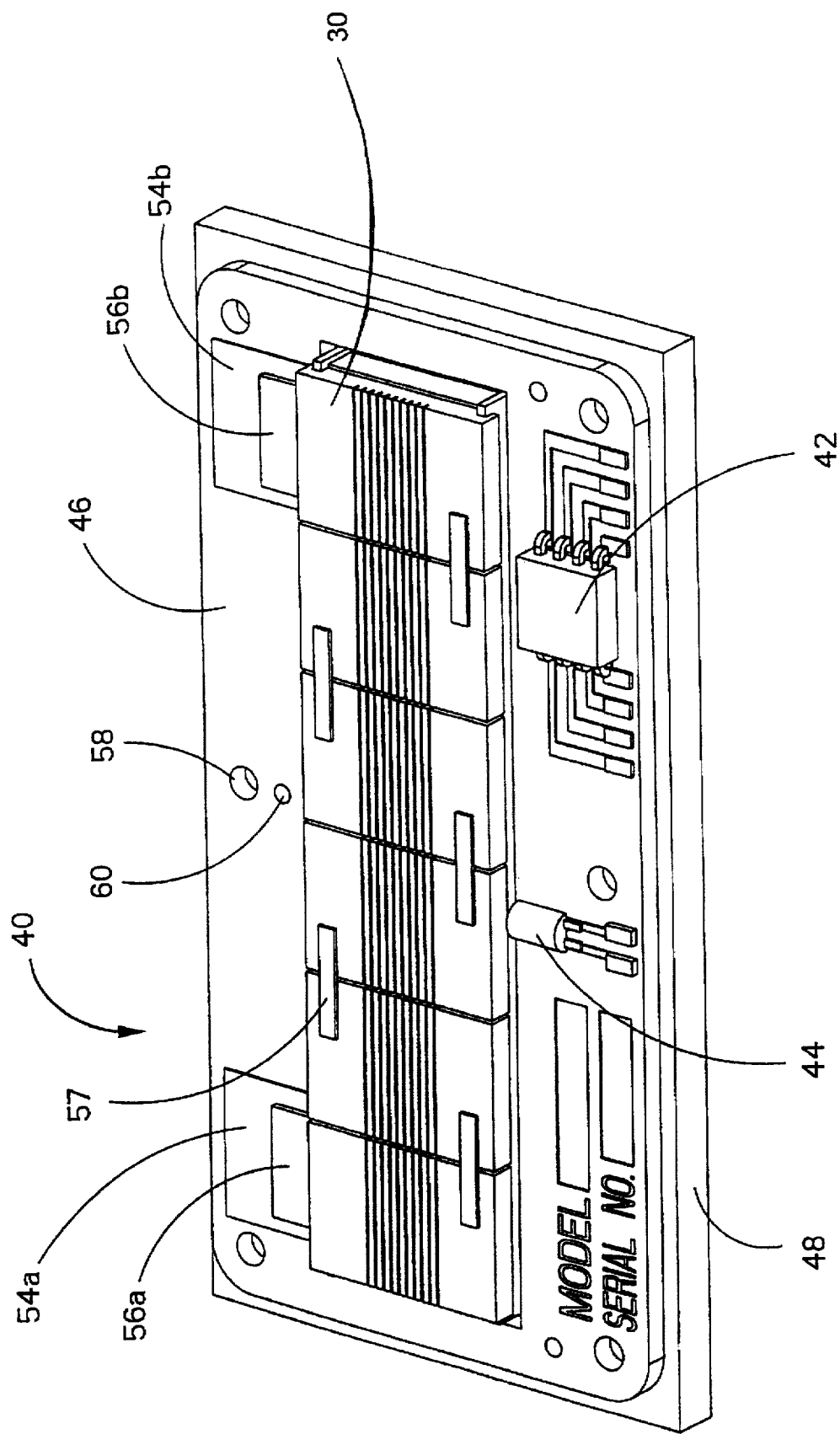

To protect the emitting surfaces of the laser diode arrays 30, a protective window 50 can be affixed to the assembly 40. The protective window 50 is supported by a retainer frame 52. The frame 52 and the window 50 may merely act to protect the upper emitting surfaces. Alternatively, the frame 52 and window 50 may completely seal the six laser diode arrays 30 by placing a sealing material between the frame 52 and the window 50. The window 50 can be made of a variety of materials including acrylic with an anti-reflective coating. Besides the window 50 that is shown, the window 50 could be replaced by a diffractive, binary, or two-dimensional array of lenses to provide focusing and collimation to the beam of energy. FIG. 2D illustrates the assembly 40 without the window 50 and retainer frame 52.

The laser diode arrays 30 require electrical energy to produce the emitted radiation. Thus, a pair of contact pads 54a and 54b are located on the PCB 46. To provide electrical energy to the laser diode arrays 30, a pair of leads 56a and 56b are disposed between the endcaps of the two end arrays 30 and the pads 54a and 54b. Adjacent arrays 30 are connected in electrical series through jumpers 57. In the case where the window 50 and the frame 52 seal the laser diodes 30, the leads 56a and 56b can be potted or bonded onto the window frame 52. The host external operating system makes electrical contact with the assembly 40 through the contact pads 54a and 54b.

The PCB 46 and the board heat sink 48 include holes 58 through which fasteners will pass to connect the assembly 40 to the ultimate heat sink which is typically a high efficiency heat exchanger. Also provided are indexing holes 60 which align the PCB 46 and, therefore, the array 30 on the ultimate heat sink.

Although the PCB 46 is shown as the intermediate structure between the array 30 and the memory device 42, other structures could be used. For example, merely providing an epoxy layer which adheres the memory device 42 to the array 30 may suffice if the epoxy provides electrical insulation.

The memory device 42 contains the operating information for the laser diode arrays 30. The types of information can range from the basic to the complex. For example, the identity of the laser diode array assembly 40 can be recorded in the memory device. This can include the wafer number of the wafers that were used to produce the laser diode bars that are contained in each array 30. It may also include the lot number of the bars comprising the arrays 30 or the laser diode bar number. It may also include an inspector number associated with the individual who approved of the bar in the quality control department.

The memory device 42 can also be loaded with performance data on the laser diode array assembly 40. For example, the center wavelength can be given as well as the wavelength shift as a function of temperature (i.e. Gallium Arsenide laser diodes shift at about 1 nanometer per about 3–4°C). The wavelength distribution of the arrays 30 can be stored so as to provide the full-width at half maximum value (FWHM) (i.e. the difference between the wavelengths at the point on the wavelength distribution curve where the intensity is at one-half of its maximum value). This FWHM value is critical when the assembly 40 is used for solid-state laser pumping applications. The wavelength can also be given as a function of spatial orientation along the assembly 40.

Information related to the output power can be included as well. For example, the output power can be given as a function of the efficiency of the arrays 30, the current and voltage at which the arrays 30 are driven, or the threshold current (i.e. the current after which lasing occurs). The output power can also be given as a function of spatial orientation along the assembly 40. Also, the estimated output power degradation of the array 30 over its service life can be stored.

The memory device 42 can also include extreme design values for various operating conditions that should not be exceeded for a particular array. For example, the maximum or minimum design operating temperature can be recorded as can the maximum design drive parameters such as current, pulse-width, duty-cycle, voltage, etc. This allows for a real-time comparison between the actual operating conditions and the extreme design conditions to ensure that no damage will occur to the laser diode array 30. The external operating system may use such a comparison to shut-down the system when the extreme design values are exceeded.

Although the memory device 42 has been described thus far as having operational information that has been recorded before its delivery to the customer, the memory device 42 can also be updated with information throughout its service life. Typically, the external operating system is monitoring various environmental conditions including temperature, vibration, shock, humidity, and also the input drive parameters. Since the operating system is configured to read from the memory device 42, the only difference needed to achieve the goal of updating the memory device 42 is merely having an external operating system with the capability to write to the memory device 42. Consequently, the memory device 42 then captures the operational history of the array 30 which is advantageous for determining the cause of failures and for warranty purposes.

The types of operational information related to the service life of the array 30 that can be recorded in the memory device 42 is quite extensive. For example, the shot-count of a pulsed laser diode array 30 or the on-time of a CW laser diode array 30 can be recorded. This is a very important value when considering the warranty of the array 30.

The extreme operating conditions which the laser diode array 30 experiences can be recorded in the memory device 42 which is also useful for warranty purposes and for determining the cause for failures. Thus, the maximum and minimum operating temperature can be recorded in the memory device 42. Other operating conditions such as the maximum shock, vibration, and humidity can be recorded as well. The maximum drive parameters (current, voltage, pulse width, frequency, etc.) can also be recorded in the memory device 42. Additionally, the extreme ambient conditions of the environment surrounding the array 30 or surrounding the entire external operating system can be stored as well (nonoperational or operational).

A list of incident reports may be recorded in the memory device 42. This may include the over-temperature failures, over-current failures, over-voltage failures, reverse-voltage failures (i.e. wrong bias across the arrays 30), coolant-flow interrupts (to the heat exchanger), and electrostatic discharge events. These faults can be recorded as merely an affirmative response to whether the fault occurred or as the value of the condition. Additionally, a drop in the voltage across the array 30 is indicative of a single laser diode failure and may be recorded. For example, a typical voltage drop across one good laser diode is approximately 2.0 volts and about 0.5 volt after certain types of failures. The number of laser diode bar failures can be estimated by such a voltage drop. Other types of fault conditions may be included as well, including those fault conditions recorded by sensors monitoring the output of the arrays 30 (i.e. wavelength and power).

Thus far, only fault conditions, operating conditions, and non-operating conditions have been discussed as being data that are recorded in the memory device 42. However, recording the dates and times of these conditions is also worthwhile and can be accomplished by having the external operating system write the times that these conditions occur in the memory device 42. When the time values are recorded, the memory device 42 then can be used to store a variety of parameters as a function of time (temperature, input power, output power, output wavelength, etc. v. time).

FIGS. 3A–3C illustrate an assembly 140 having multiple arrays 30 similar to the assembly 40 of FIGS. 2A–2D. The assembly 140 includes a processor 143 and a temperature sensor 144 that are mounted on a PCB 146. A heat sink 148 is located on the backside of the PCB 146 and is the structure to which the arrays 30 are attached. Each array 30 has a corresponding photodetector 149 which measures the output characteristics of the emitted light. As shown best in FIG. 3C, the emitted light reflects partially off the inside surface of the window 150 and then hits the photodetector 149. The photodetector 149 may measure the power of the reflected light which corresponds to the output power of the entire array 30. Alternatively, the photodetector 149 may be of a more advanced type that measures the output wavelength of the reflected beam which corresponds to the output wavelength of the emitted output.

The processor 143 as shown includes a memory portion which allows basic information to be stored therein (extreme operating temperatures, input powers, etc.) If a larger amount of information is to be stored, then it may be desirable to include a separate memory chip on the PCB 146, like the memory device 42 in FIG. 2, and couple it to the processor 143 for storing the additional data. This may be required when the operational history of the laser diode array 30 is to be recorded.

The processor 143 is coupled to the temperature sensor 144 and to the photodetectors 149 through traces on the PCB 146. The processor 143 is also coupled to an external operating system through contact pads 147. In this way, the processor 143 determines the appropriate drive levels to be supplied by the external operating system based on the conditions it monitors through the temperature sensor 144 and the photodetectors 149. The processor 143 also instructs the external operating system to supply the coolant at a temperature and a rate that maintains the temperature of the temperature sensor 144 at the desired value. The processor 143, therefore, provides a self-calibrating system in that any deviations seen in the output power and wavelength can be altered by instructing the operating system to change the input drive parameters and the coolant characteristics.

The processor 143 would typically be an Application Specific Integrated Circuit (ASIC) or a hybrid, custom-manufactured model.

Figures 4A, 4B:
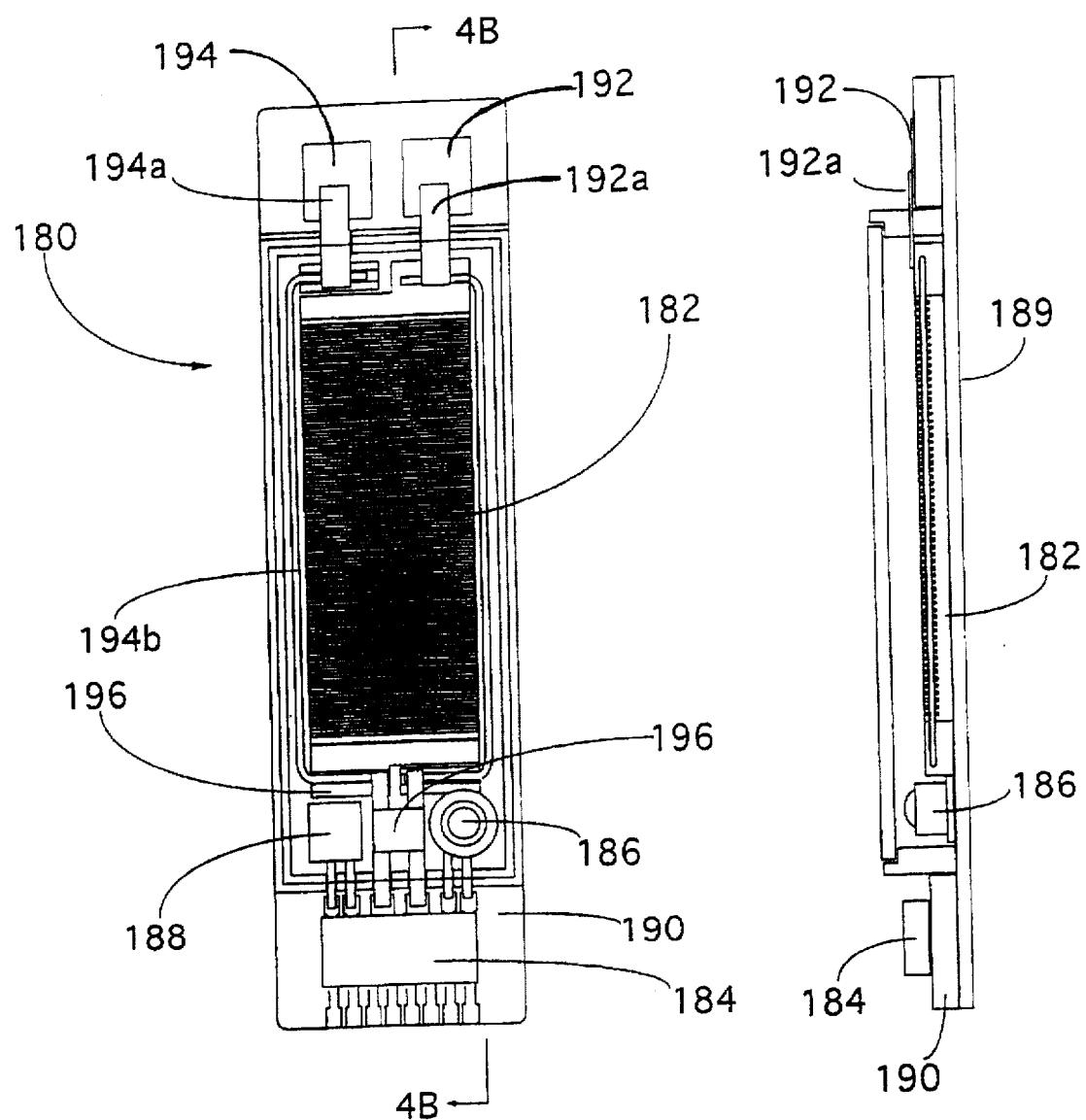
FIGS. 4A-4B are views of a single-array assembly having an integral processing device including a memory device, a sensor, and a photodetector.

FIGS. 4A and 4B illustrate an assembly 180 having a single array 182, a processor 184, a photodetector 186, and a temperature sensor 188. The array 182 holds substantially more bars than arrays 10 and 30 of FIGS. 1A and 1B. The photodetector 186 and the temperature sensor 188 are mounted on a PCB 190 and are coupled to the processor 184 which is also mounted on the PCB 190. The array 182 is mounted to a heat sink 189 below the PCB 190. Power is supplied to the array 182 via a pair of contacts 192 and 194 which are coupled to the array 182 via leads 192a and 194a. A trace 194b runs within the PCB 190 from the lead 194a to the endcap of the array 182 adjacent the photodetector 186.

The processor 184 has internal memory portion with enough capacity to perform the required tasks. Alternatively, a memory device can be mounted on the PCB 190 and coupled to the processor 184.

Also connected to the processor 184 is a circuit 196 which limits high power being received by the processor 184. This circuit 196 is coupled to the input power leads and allows the processor 184 to determine the voltage drop across the array 182 or the current therethrough. Because the array 182 is usually coupled in series with a field effect transistor (FET) and a known voltage drop occurs across the diode array 182 and the FET, the processor 184 could also monitor the voltage drop across the FET to determine the voltage drop across the array 182. The change in the voltage drop across the array 182 is indicative of a failure of the individual laser diode bars within the array 182. The circuit 196 may include a fuse for guarding against high voltage or high current.

The use of such a circuit 196 also permits the counting of each shot supplied to the array 182 or the amount of on-time if array 182 is a CW laser. Thus, the processor 184 would count and store these values.

Although the circuit 196 has been described as one which measures the voltage drop across the array 182 or counts shots, it could also include a reverse-bias sensor (possibly an electrical diode) that permits the flow of current in one direction. If a voltage is applied in the wrong direction, then the current will flow through the electrical diode instead of the array 182 which decreases the likelihood of any harm to the array. Thus, the processor 184 can monitor the occurrence of a reverse-bias fault.

The circuit 196 can also include components for monitoring a electrostatic discharge across the array 182. Thus, the processor 184 could monitor this circuit 196 for such an event and record it as well.

Figure 5:
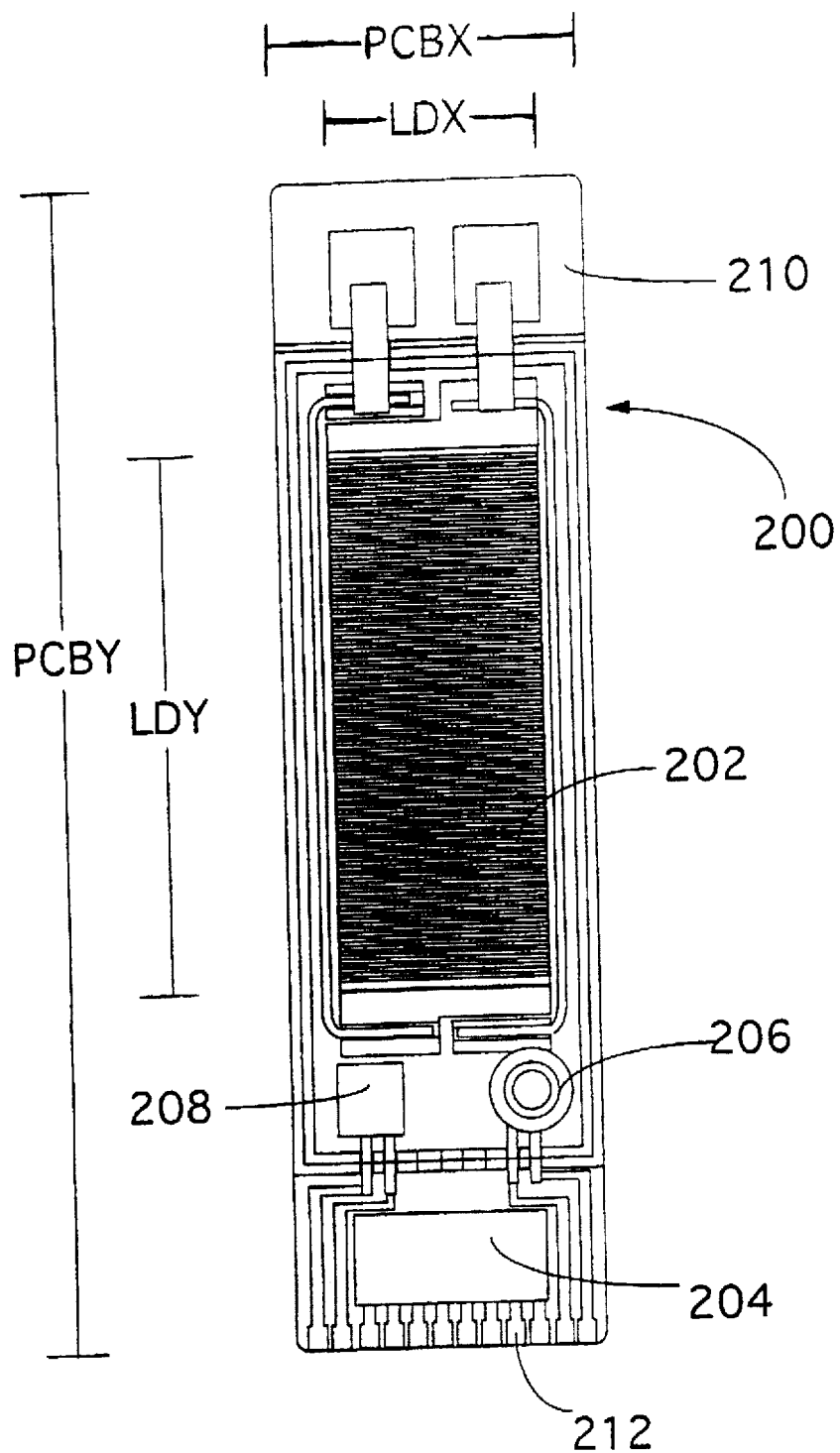
FIG. 5 is a plan view of a single-array assembly having an integral memory device, a temperature sensor, and a photodetector.

FIG. 5 illustrates an assembly 200 having a single array 202, a memory device 204, a photodetector 206, and a temperature sensor 208. These memory device 204 and the photodetector 206 are mounted on a PCB 210 while the array is mounted on a heat sink on the bottom of the PCB 210. Thus, this single-array assembly 200 does not have the processing capability of assembly 180 in FIG. 4. Instead, assembly 200 supplies to the external operating system the operational information needed to operate the array 202. Also, the memory device 204 can be configured to receive and record information (fault conditions, operating conditions, etc.) from the external operating system.

The external operating system communicates with the memory device 204 by the contact pads 212 at the edges of the PCB 210. Likewise, the external operating system communicates with the photodetector 206 and the temperature sensor 208 via the pads 212.

FIG. 5 also illustrates the geometrical configuration of the assembly 200. The emitting surfaces of the laser diode array 202 are within an area defined by LDY multiplied by LDX. The area of the PCB 210 is defined PCBX multiplied by PCBY. It is desirable to keep the ratio of the PCB area to the emitting area as low as possible such that the assembly 200 having these additional components (e.g. sensors, memory devices, processors, etc.) is not much larger that just the array. This is important for retrofitting purposes. Generally, the ratio of the PCB area to the emitting area is less than approximately 10 to 1. In a preferred embodiment, the ratio is in the range from about 5 to 1 to about 7 to 1. When a connector is added to the PCB 210 (see FIGS. 7 and 9 below), the ratio is less than about 14 to 1.

Figure 6:
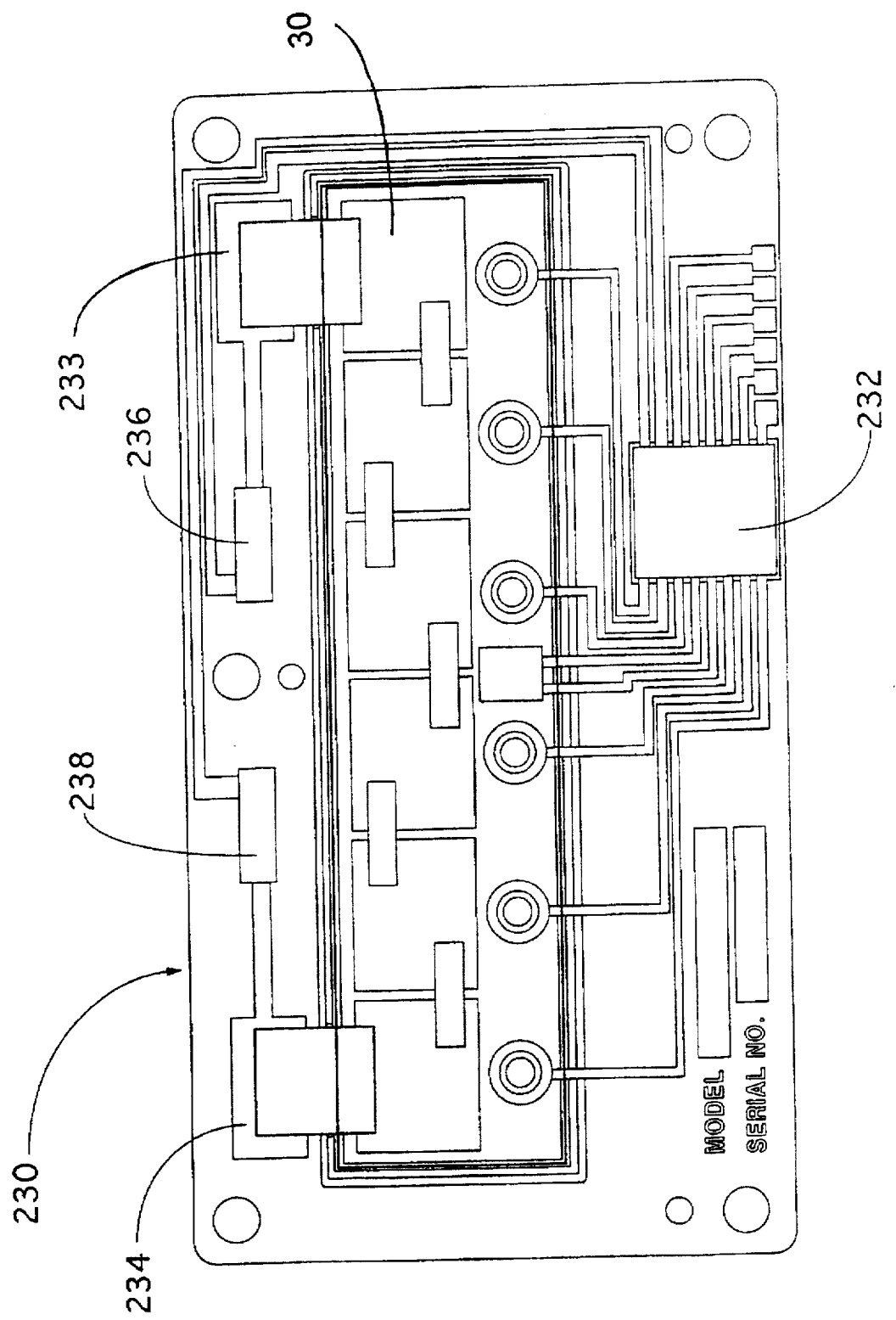
FIG. 6 is a plan view of a multiple-array assembly having an integral processing device including a memory device, a temperature sensor, multiple photodetectors, and an input power sensing device.

FIG. 6 illustrates an assembly 230 having six arrays 30 which is very similar to the assembly 140 shown in FIGS. 3A–3C. However, the processor 232 is coupled to the contacts 233 and 234 through circuits 236 and 238. These circuits 236 limit the high power to the processor 232 so as to allow the processor 232 to determine the voltage drop across the six arrays 30.

Again, circuits 236 and 238 may instead, or in addition to what is described above, provide for electrostatic discharge sensing.

Circuits 236 and 238 may also be used for counting the shots of a pulsed laser or the on-time for a CW laser since the processor 232 can receive a signal from these circuit each time power is supplied to the assembly 230. Alternatively, if circuits 236 include an electromagnetic sensor (e.g. a Hall's Effect sensor) then they just need to be in close proximity to the arrays 30 or the contact pads 233 and 234 such that each time a high-current pulse is supplied to the assembly 200, the Hall's Effect sensor is tripped by the resultant electromagnetic field. The processor 232 then receives the signal after each shot.

The arrays 30 have a finite life which is in a large part a function of the temperature at which they are operated and the power is supplied thereto. Because the processor 232 monitors both the temperature and the input power, the processor 232 can compare these values to a range of standard, assumed, operating conditions. Then, the processor 232 modifies the estimated life at a predetermined rate programmed in the processor 232 based on the actual conditions under which the arrays 30 are being operated. In a preferred embodiment, not only would the processor 232 inform the external operating system of the amount of service that is remaining, but the processor 232 would also inform the external operating system of the amount that the estimated life has been adjusted based on the actual operating conditions.

Figure 7:
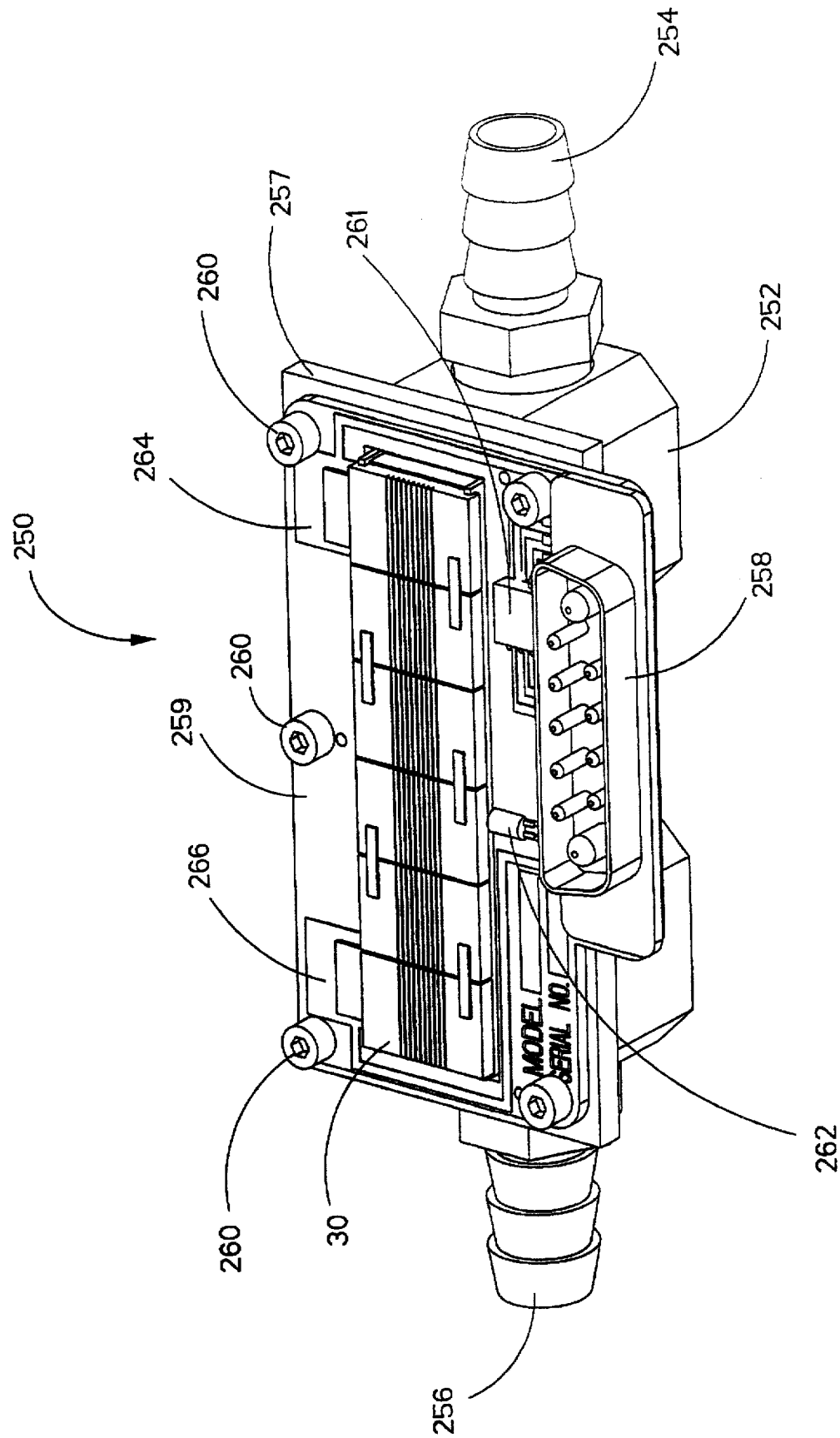
FIG. 7 is perspective view of the multiple-array assembly of FIGS. 3A-3C including a connector and being installed on a heat exchanger.

FIG. 7 illustrates an assembly 250, similar to the one shown in FIGS. 2A–2D, that is mounted on a heat exchanger 252 having an inlet port 254 and an outlet port 256. The assembly 250 further includes a connector 258 to which the external operating system is coupled. The arrays 30 are connected to the heat sink 257 of the PCB 259. The heat sink 257 of the PCB 259 is mounted on the heat exchanger 252 by a series of fasteners 260.

The connector 258 is coupled to a memory device 261, to a sensor 262 (i.e. one of the types discussed thus far), and to power supply contact pads 264 and 266. Each of these devices is mounted on the PCB 259 and is coupled to the connector 258 through traces located on the PCB 259. The connector 258 provides for an easy connection between the assembly 250 and the external operating system.

Figure 8:
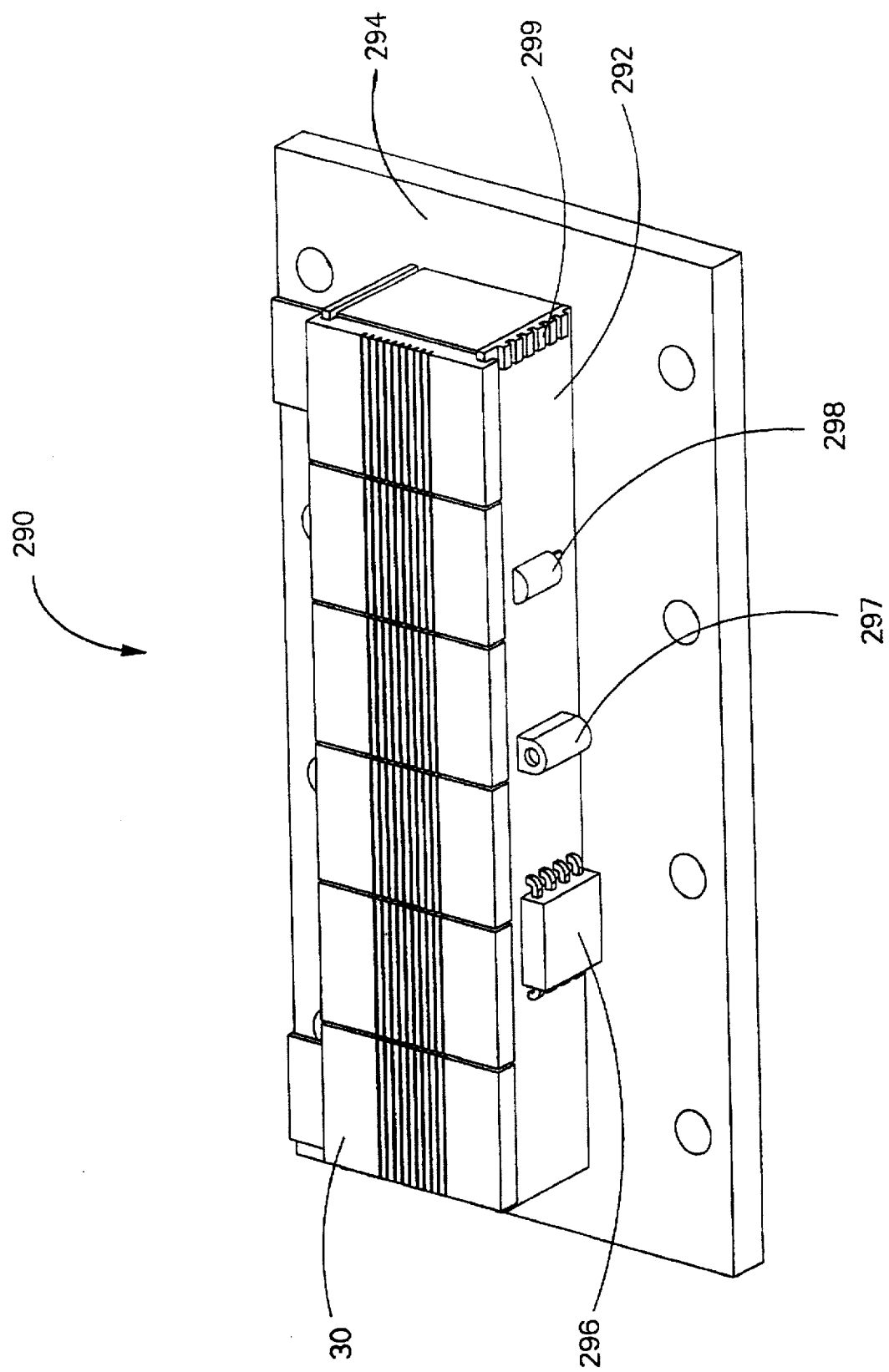
FIG. 8 is a perspective view of a multiple-array assembly having an printed circuit board positioned at approximately 90° degrees from the plane in which the emitting surfaces reside.

FIG. 8 illustrates an alternative embodiment in which an assembly 290 includes a PCB 292 that is located in a plane that is generally perpendicular to the emitting surfaces of arrays 30. Consequently, the arrays 30 are elevated slightly from a base 294 which attaches the assembly 290 to a heat exchanger. Again, the assembly 290 includes a memory device 296 and two sensors 297 and 298. Typically, sensor 298 is a temperature sensor and sensor 297 is a photodetector. Each of the sensors 297 and 298 and the memory device 296 are coupled to contact pads 299 at the end of the PCB 292 through traces (not shown) in the PCB 292. The assembly 290 communicates with the external operating system through these contact pads 299.

Figure 9:
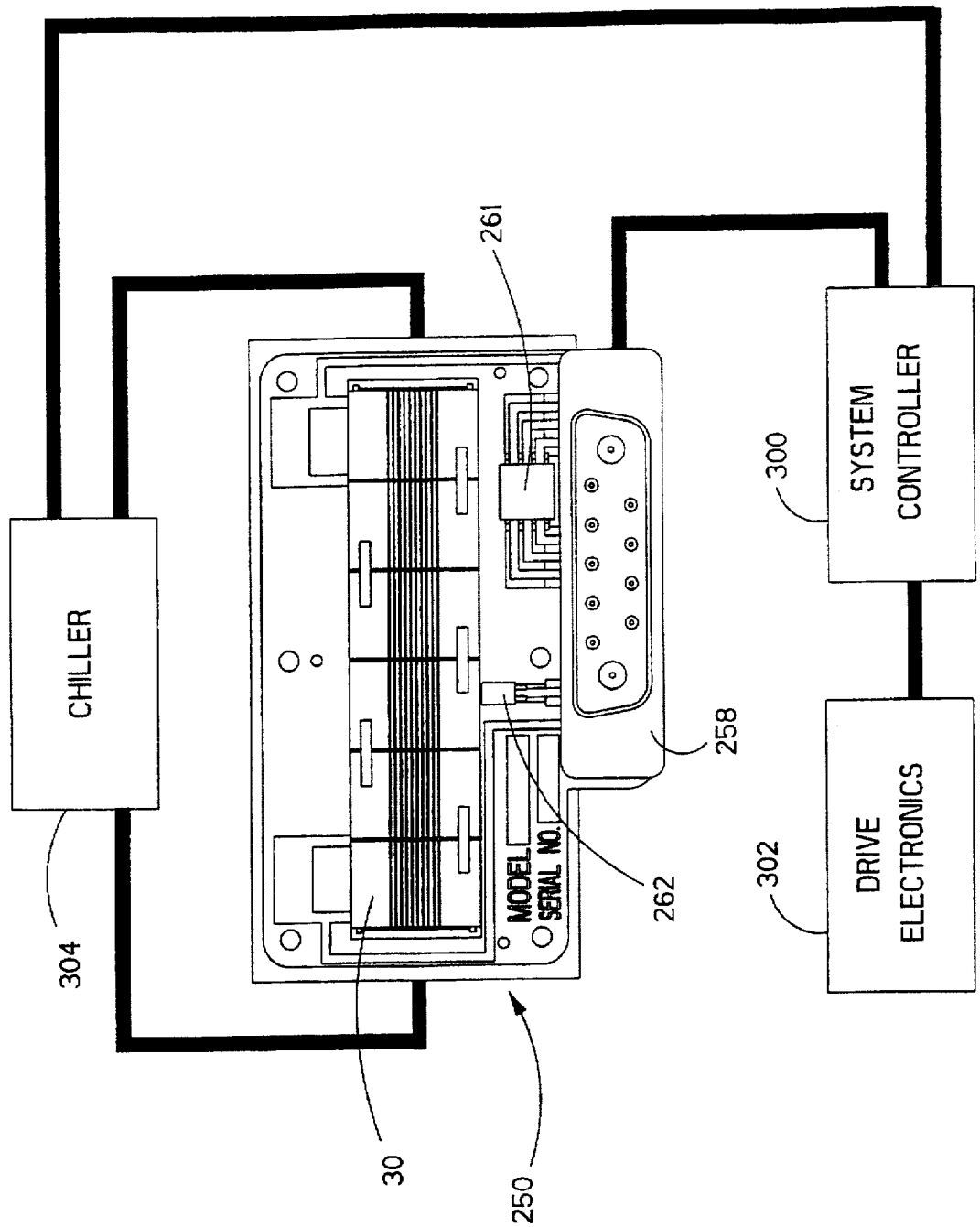
FIG. 9 is a schematic view of a multiple-array assembly incorporating the present invention and being installed in an external operating system.

FIG. 9 illustrates the assembly 250 of FIG. 7 installed in the external operating system. Thus, a system controller 300 is coupled to drive electronics 302 which supply the electrical power needed to operate the diode arrays 30. The system controller 300 is also coupled to a chiller 304 which supplies the cooling fluid to the heat exchanger 252 (FIG. 7). The system controller 300 receives operational information from the memory device 261 via the connector 258. For example, the operational information received from the memory device 261 may inform the controller 300 that to obtain X watts of output power at 808 nanometers, the temperature at the temperature sensor 262 must be 31° C. and the arrays must be driven at 110 amps with a rate of 30 Hz, and a pulse width of 220 microseconds. The system controller 300 then causes the drive electronics 302 to supply the requested input power and causes the chiller 304 to provide coolant at a rate and a temperature that will maintain sensor 262 at 31 °C.

Although the cooling system has been described as a chiller 304, the system could also be one which utilizes solid-state thermoelectric coolers such as those manufactured by Marlow Industries of Dallas, Tex. The cooling capacity of these devices varies as a function of the input power. Thus, the system controller 300 would control the electrical power to the thermoelectric coolers such that their cooling capacity would result in the desired temperature at the arrays 30.

The controller 300 also may store in the memory device 261 operational conditions if the configuration of the memory device 241 allows for this information. Thus, the controller 300 could record to the memory device 261 extreme operating conditions (temperature, humidity, shock, vibration, the amount of on-time or the number of shots, etc.), extreme non-operating conditions (temperature, humidity, shock, vibration), extreme input powers (current, voltage, duty cycle, etc.), and fault conditions (coolant non-flow condition, electrostatic discharge, over-temperature fault, over-power fault, reverse-bias faults). Clearly, sensors (vibration sensors, shock sensors, humidity sensors, etc.) which measure these types of operating conditions would need to be incorporated onto the PCB or be adjacent the assembly 250 and monitored by the controller 300.

If a processor is used on the assembly 250, then the processor may monitor these sensors instead of the controller 300 monitoring them. Additionally, a processor could monitor the output of the assembly 250 and provide real-time modifications to the instructions sent to the system controller 300. Thus, the basic operating information stored in the memory device 261 would serve as a starting point for operation and be modified based on the conditions sensed by the sensors and monitored by the processor.

Figure 10:
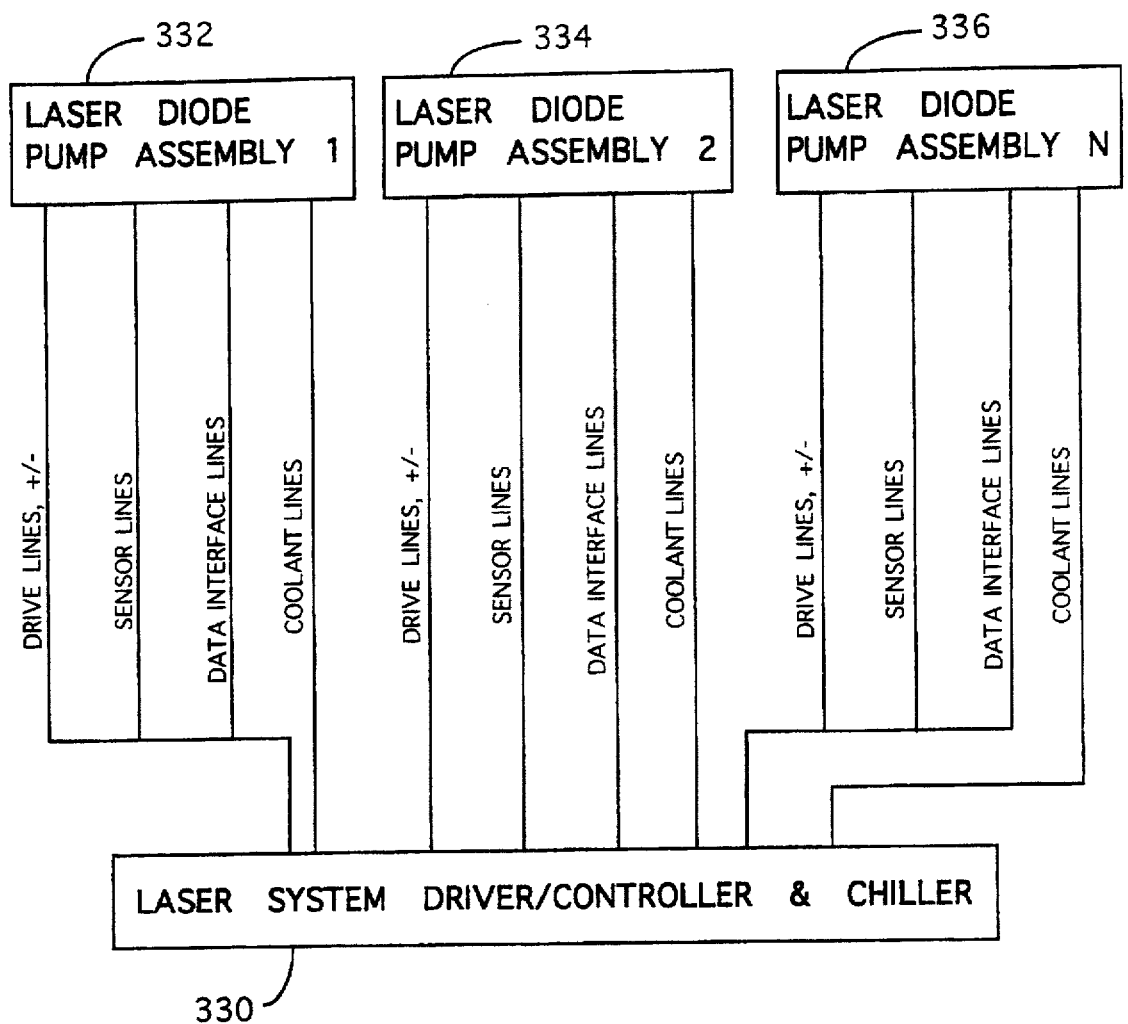
FIG. 10 is a schematic view of an external operating system being coupled to multiple assemblies labeled 1-N.

FIG. 10 is a schematic illustrating a concept similar to what is shown in FIG. 9 except that the external operating system 330 is coupled to multiple assemblies 332, 334, 336 to produce the desired output. For example, the desired output from each assembly may by X watts at 808 nanometers. The operating system 330 then receives information from each assembly 332, 334, and 336 through the data interface lines which indicates the temperature and input power require to produce this output. Each assembly 332, 334, and 336 will usually require slightly different operating parameters (e.g. 33° C., 36° C., and 32° C.; or 105A, 108A, and 101A) to achieve the desired output. Consequently, the operating system 330 supplies coolant and input power at different levels to each assembly 332, 334, and 336. The operating system 330 may monitor sensors on the assemblies 332, 334, 336 through the sensor lines. Alternatively, if a processor is present on each of the assemblies 332, 334, 336, the processor may monitor the sensors and instruct the operating system 330 accordingly through the data interface lines.

The present invention is quite useful for numerous reasons. For example, one of the main factors affecting yield and, therefore, the cost of laser diode pump arrays, is selecting only laser diode bars within a small spectral range for incorporation into one array. There is a significant cost savings if it is possible to use pump arrays which have a larger range in their peak emission spectra, since the system control electronics will be able to compensate for the array's spectral differences by using the stored thermal and spectral (wavelength) information. Furthermore, storing the thermal/ spectral data within the assembly considerably simplifies replacement of a used or damaged assembly by allowing for the automatic compensation for the new assembly by merely accessing this data within the assembly's memory device. There is no longer the need to build a replacement array that exactly matches the used or damaged array.

Because the shot count or timer is integral with the assembly, rather than with the external control system electronics, the records are accurately maintained. And, a simplified way of recording significant events (faults, extreme conditions, etc.) is provided. Consequently, the need for meticulously recording this type of information on paper is obviated and, therefore, the integrity of the operational information on the array is greatly improved. Accessing this information from the memory device of the assembly is also useful for later analyzing the problems experience by the assembly.

The safety features of the assembly are greatly improved by providing in-situ monitoring of such operating conditions such as the array's voltage, temperature, ambient humidity, and the occurrence of fault conditions. This information can be used to shut-down the assembly to avoid damage to the assembly or injury to the operator of the assembly.

Each of these embodiments and obvious variations thereof is contemplated as falling within the spirit and scope of the invention, which is set forth in the following claims.

What is claimed is:

1. A modular laser diode array assembly, comprising:

at least one laser diode array having a plurality of laser diodes, each of said plurality of laser diodes being in electrical contact with at least one other of said plurality of laser diodes;

an intermediate structure to which said at least one laser diode array is attached;

a memory device mounted on said intermediate structure for storing operating information for said at least one laser diode array, said memory device for communicating with an external operating system.

2. The modular laser diode array assembly of claim 1, wherein said operating information includes the serialization identity of said at least one laser diode array.

3. The modular laser diode array assembly of claim 1, wherein said operating information includes an estimate of output energy degradation over the service life of said at least one laser diode array.

4. The modular laser diode array assembly of claim 1, wherein said operating information includes a wavelength of output energy as a function of temperature of said at least one laser diode array.

5. The modular laser diode array assembly of claim 1, wherein said operating information includes output energy of said at least one laser diode array as a function of input power.

6. The modular laser diode array assembly of claim 1, wherein said external operating system records in said memory device updated operating information based on the performance of said at least one laser diode array.

7. The modular laser diode array assembly of claim 1, wherein said external operating system records in said memory device operating conditions experienced by said at least one laser diode array.

8. The modular laser diode array assembly of claim 7, wherein said operating conditions include a maximum temperature of said at least one laser diode array.

9. The modular laser diode array assembly of claim 7, wherein said operating conditions include a maximum power supplied to said at least one laser diode array.

10. The modular laser diode array assembly of claim 7, wherein said operating conditions include a total on-time or shot-count of said at least one laser diode array.

11. The modular laser diode array assembly of claim 7, wherein said operating conditions include a maximum ambient condition to which said at least one laser diode array is subjected.

12. The modular laser diode array assembly of claim 7, wherein said operating conditions include a fault condition experienced by said at least one laser diode array, said fault condition being one of the group consisting of a reverse-bias fault, a coolant flow fault, an extreme power input fault, an extreme temperature fault, and an electrostatic discharge fault.

13. The modular laser diode array assembly of claim 7, wherein the time that one of said operating conditions said operating conditions occurs is recorded in said memory device.

14. The modular laser diode array assembly of claim 1, further including a temperature sensor for providing said external operating system with a temperature of said at least one laser diode array.

15. The modular laser diode array assembly of claim 14, wherein said external operating system includes means to remove heat from said at least one laser diode array, said external operating system controlling the operation of said heat removal means in response to said temperature monitored via said temperature sensor.

16. The modular laser diode array assembly of claim 1, further including an optical sensor for providing said external operating system with optical characteristics of said array.

17. The modular laser diode array assembly of claim 1, wherein said intermediate structure includes a printed circuit board on which said memory device is mounted, said printed circuit board further having a surface on which said at least one laser diode array is mounted.

18. The modular laser diode array assembly of claim 17, wherein said at least one laser diode array includes an emitting surface, said emitting surface being in a plane that is askew with said printed circuit board.

19. The modular laser diode array assembly of claim 17, wherein said printed circuit board includes a connector to which said external operating system is coupled.

20. A modular laser diode array assembly, comprising:
at least one laser diode array having a plurality laser diodes, each of said plurality of laser diodes being in electrical contact with at least one other of said plurality of laser diodes;
an intermediate structure to which said at least one laser diode array is mounted;
at least one sensor for sensing operating conditions experienced by said at least one laser diode array;
a memory device for storing operating information of said at least one laser diode array and being mounted on said intermediate structure; and
processing means being mounted on said intermediate structure and being coupled to said at least one sensor for monitoring said operating conditions, said processing means being coupled to said memory device and to an external operating system.

21. The modular laser diode array assembly of claim 20, wherein said operating information includes the serialization identity of said at least one laser diode array.

22. The modular laser diode array assembly of claim 20, wherein said operating information includes an estimate of output energy degradation over the service life of said at least one laser diode array.

23. The modular laser diode array assembly of claim 20, wherein said operating information includes a wavelength of output energy as a function of temperature of said at least one laser diode array.

24. The modular laser diode array assembly of claim 20, wherein said operating information includes output energy of said at least one laser diode array as a function of input power.

25. The modular laser diode array assembly of claim 20, wherein said memory device is integral with said processing means.

26. The modular laser diode array assembly of claim 20, wherein said processing means records said operating conditions sensed by said at least one sensor in said memory device.

27. The modular laser diode array assembly of claim 26, wherein said recorded operating conditions include a maximum temperature of said at least one laser diode array.

28. The modular laser diode array assembly of claim 26, wherein said recorded operating conditions include a maximum power supplied to said at least one laser diode array.

29. The modular laser diode array assembly of claim 26, wherein said recorded operating conditions include a total on-time or shot-count of said at least one laser diode array.

30. The modular laser diode array assembly of claim 26, wherein said recorded operating conditions include a maximum ambient condition to which said at least one laser diode array is subjected.

31. The modular laser diode array assembly of claim 26, wherein said operating conditions include a fault condition experienced by said at least one laser diode array, said fault condition being one of the group consisting of a reverse-bias fault, a coolant flow fault, an extreme power input fault, an extreme temperature fault, and an electrostatic discharge fault.

32. The modular laser diode array assembly of claim 20, wherein said at least one sensor includes a temperature sensor measuring a temperature of said at least one laser diode array.

33. The modular laser diode array assembly of claim 20, wherein said at least one sensor includes an optical sensor for measuring the output energy of said at least one laser diode array.

34. The modular laser diode array assembly of claim 20, wherein said at least one sensor includes an optical sensor for measuring the output wavelength of the output energy of said at least one laser diode array.

35. The modular laser diode array assembly of claim 20, wherein said at least one sensor includes a voltage sensor for measuring the voltage across said at least one laser diode array.

36. The modular laser diode array assembly of claim 20, wherein said at least one sensor includes a current sensor positioned between said power contacts pads for measuring the current through said at least one laser diode array.

37. The modular laser diode array assembly of claim 35, wherein said voltage sensor includes a fuse for relieving a high-voltage condition.

38. The modular laser diode array assembly of claim 36, wherein said current sensor includes a fuse for relieving a high-current condition.

39. The modular laser diode array assembly of claim 20, wherein said processing means instructs said external operating system to drive said at least one laser diode array at a power level delineated by said operating information stored in said memory device.

40. The modular laser diode array assembly of claim 39, wherein said power level is updated based on said operating conditions monitored by said processing means via said at least one sensor.

41. The modular laser diode array assembly of claim 40, wherein said sensor is a temperature sensor measuring a temperature of said at least one laser diode array.

42. The modular laser diode array assembly of claim 40, wherein said sensor is an optical sensor measuring optical characteristics of said at least one laser diode array.

43. The modular laser diode array assembly of claim 20, wherein said external operating system includes means to remove heat from said at least one laser diode array and said at least one sensor includes a temperature sensor, said processing means instructing said external operating system to operate said heat removal means at a specified level in response to a temperature monitored via said temperature sensor.

44. The modular laser diode array assembly of claim 20, wherein said intermediate structure includes a printed circuit board on which said memory device and said processing means are mounted, said printed circuit board further having a surface on which said at least one laser diode array is mounted.

45. The modular laser diode array assembly of claim 44, wherein said at least one laser diode array includes an emitting surface, said emitting surface being in a plane that is askew with said printed circuit board.

46. The modular laser diode array assembly of claim 44, wherein said at least one sensor is mounted on said printed circuit board.

47. The modular laser diode array assembly of claim 44, wherein said printed circuit board includes a connector to which said external operating system is coupled.

48. The modular laser diode array assembly of claim 44, wherein said at least one sensor includes a temperature sensor and an optical sensor, said temperature sensor and said optical sensor being mounted on said printed circuit board.

49. The modular laser diode array assembly of claim 20, further including a window disposed above an emitting surface of said at least one laser diode array.

50. A modular laser diode array assembly, comprising:

at least one laser diode array having a plurality laser diodes, each of said plurality of laser diodes being in electrical contact with at least one other of said plurality of laser diodes, said at least one laser diode array having an emitting region where energy is emitted from each of said laser diode arrays, said emitting region defining an emitting area;

a printed circuit board mechanically coupled to said at least one laser diode array, said printed circuit board including a plurality of contact pads and having a board area, the ratio of said board area to said emitting area being less than approximately 10.

a memory device for storing operating information on said plurality of laser diodes and being mounted on said printed circuit board, said memory device being coupled to said plurality of processing contact pads for communicating with an external operating system.

51. The modular laser diode array assembly of claim 50, wherein said ratio is in the range from about 5 to about 7.

52. The modular laser diode array assembly of claim 50, further including at least one sensor for monitoring an operating condition of said at least one laser diode array, said sensor being electrically coupled to said printed circuit board.

53. The modular laser diode array assembly of claim 52, further including processing means monitoring said at least one sensor and being coupled to said external operating system.

54. The modular laser diode array assembly of claim 53, wherein said printed circuit board includes a connector thereby increasing the area of said board to a second area, the ratio of said second area to said emitting area being increased to approximately 14.

55. A method of operating a laser diode array comprising the steps of:

providing a laser diode array having an associated memory device;

storing operating data for said laser diode array in said associated memory device;

assembling said laser diode array into an operating system having drive electronics and a controller, said drive electronics being coupled to said laser diode array, said controller being coupled to said drive electronics and to said associated memory device;

instructing said controller to retrieve said operating data from said associated memory device; and powering said drive electronics at an electrical drive state corresponding to said operating data to produce output energy from said laser diode array.

56. The method of claim 55, further including the steps of:

monitoring an operating condition of said laser diode array with at least one sensor;

selecting other operating data in response to said operating condition monitored by said at least one sensor; and instructing said controller to retrieve said other operating data so as to modify said electrical drive state.

57. The method of claim 56, wherein said at least one sensor is a temperature sensor measuring a temperature of said laser diode array.

58. The method of claim 56, wherein said at least one sensor is an optical output sensor for monitoring the output energy of said laser diode array.

59. The method of claim 56, wherein said at least one sensor is a wavelength sensor for monitoring a wavelength of the output energy of said laser diode array.

60. The method of claim 55, wherein said operating data is capable of being externally altered throughout the lifetime of said laser diode array.

61. The method of claim 60, wherein said controller of said operating system alters said operating data by recording in said memory device updated operating data.

62. The method of claim 56, wherein said at least one sensor includes a temperature sensor and said other operating data includes output energy as a function of temperature.

63. The method of claim 55, wherein said associated memory device is integral with said laser diode array.

64. A method of determining an operating history of a laser diode array comprising the steps of:

providing a laser diode array assembly having an integral memory device;

assembling said laser diode array into an operating system having drive electronics and a controller, said drive electronics being coupled to said laser diode array, said controller being coupled to said drive electronics and to said integral memory device;

powering said drive electronics to produce output energy from said laser diode array;

monitoring operating conditions of said laser diode array; and recording said operating conditions in said integral memory device.

65. The method of claim 64, further including a step recording a serialization identity of said laser diode array assembly in said memory device.

66. The method of claim 64, wherein said step of monitoring said operating conditions includes the step of sensing said operating conditions with at least one sensor integrally packaged with said laser diode array assembly.

67. The method of claim 66, wherein said laser diode assembly further includes processing means coupled to said memory device and to said sensor, said processing means monitoring said operating conditions via said sensor and recording said operating conditions in said integral memory device.

68. The method of claim 66, wherein step of recording said operating conditions includes the step of said controller monitoring said at least one sensor and said step of recording said operating conditions is accomplished by said controller.

69. The method of claim 64, wherein said step of monitoring said operating conditions includes the step of sensing said operating conditions with a sensor positioned adjacent to said laser diode array.

70. The method of claim 64, wherein said step of monitoring and recording said operating parameters further includes the step of monitoring and recording an amount of total on-time or shot-count of said laser diode array.

71. A method of predicting an operating life of a laser diode array comprising the steps of:

(a) providing a laser diode array having an integral memory device;

(b) recording in said memory device an estimated life based on a standard operating temperature and a standard input power;

(c) assembling said laser diode array into an operating system having drive electronics and a controller, said drive electronics being coupled to said laser diode array, said controller being coupled to said drive electronics and to said integral memory device;

(d) powering said drive electronics to produce output energy from said laser diode array;

(e) monitoring an actual operating temperature and an actual input power;

(f) comparing said actual input power to said standard input power;

(g) comparing said actual operating temperature to said standard operating temperature; and (h) adjusting said estimated life to an adjusted estimated life based on steps (f) and (g).

72. The method of claim 71, wherein said estimated life is given in a value of number of shots.

73. The method of claim 71, wherein said steps (e) though (h) are repeated when at least one of said actual input power and said actual operating temperature is outside a predetermined range, said standard input power and said standard operating temperature being within said predetermined range.

74. The method of claim 71, further including the step of instructing said controller of operating system of said adjusted estimated life.

75. The method of claim 71, further including the steps of:

monitoring an amount of total on-time or shot-count of said laser diode array;

periodically instructing said controller of operating system of the difference between said amount of total on-time or shot-count and said adjusted estimated life.

76. The method of claim 71, wherein said steps (b), (e), and (g) further include, respectively, the steps of:

recording in said memory device an estimated life based on standard ambient condition;

monitoring an actual ambient condition; and comparing said actual ambient condition to said standard ambient condition.

* * * * *

UNITED STATES PATENT AND TRADEMARK OFFICE
CERTIFICATE OF CORRECTION

PATENT NO. : 5,734,672

DATED : March 31, 1998

INVENTOR(S) : Theodore S. McMinn, Dana A. Marshall, Michael A. Hope, Georffrey O. Heberle It is certified that error appears in the above-identified patent and that said Letters Patent is hereby corrected as shown below:

Claim 13, column 12, lines 49-50, delete "said operating conditions"; (2nd occur.)

Claim 20, column 13, line 12, after "plurality" insert --of--;

Claim 65, column 16, line 41, after "step" insert --of--.

Signed and Sealed this

Twelfth Day of January, 1999

Attest:

Attesting Officer

*Acting Commissioner of Patents and Trademarks*